(12) United States Patent
Dieckmann et al.

(10) Patent No.: US 11,198,417 B2
(45) Date of Patent: Dec. 14, 2021

(54) METHOD FOR TEACHING SWITCHING PARAMETERS OF A SOLENOID CONTROL VALVE IN A BRAKING SYSTEM OF A VEHICLE, AND BRAKING SYSTEM

(71) Applicant: WABCO GmbH, Hannover (DE)

(72) Inventors: Thomas Dieckmann, Pattensen (DE); Sebastian Kuehne, Sarstedt (DE); Andreas Goers, Pattensen (DE); Ralph-Carsten Luelfing, Garbsen (DE); Oliver Wulf, Neustadt (DE)

(73) Assignee: ZF CV SYSTEMS EUROPE BV, Brussels (BE)

( * ) Notice: Subject to any disclaimer, the term of this patent is extended or adjusted under 35 U.S.C. 154(b) by 337 days.

(21) Appl. No.: 16/493,328

(22) PCT Filed: Mar. 22, 2018

(86) PCT No.: PCT/EP2018/057365
§ 371 (c)(1),
(2) Date: Sep. 12, 2019

(87) PCT Pub. No.: WO2018/192737
PCT Pub. Date: Oct. 25, 2018

(65) Prior Publication Data
US 2021/0155209 A1    May 27, 2021

(30) Foreign Application Priority Data
Apr. 20, 2017    (DE) .................... 10 2017 003 784.1

(51) Int. Cl.
*B60T 8/17*    (2006.01)
*B60T 8/174*    (2006.01)
(Continued)

(52) U.S. Cl.
CPC .............. *B60T 8/174* (2013.01); *B60T 8/171* (2013.01); *B60T 15/025* (2013.01);
(Continued)

(58) Field of Classification Search
CPC ....................................................... B60T 8/174
See application file for complete search history.

(56) References Cited

U.S. PATENT DOCUMENTS 5,496,098 A * 3/1996 Brearley .................. B60T 1/08
                                                          303/22.2
5,681,992 A    10/1997 Klein et al.
(Continued)

FOREIGN PATENT DOCUMENTS

DE    3415193 A1 * 12/1985    ................ B60T 8/90
DE    19510933 A1    9/1996
(Continued)

*Primary Examiner* — Alex C Dunn
(74) *Attorney, Agent, or Firm* — Leydig, Voit & Mayer, Ltd.

(57) ABSTRACT

A method for specifying switching parameters of a solenoid control valve in a braking system of a vehicle includes stipulating a test vehicle acceleration and ascertaining at least two test pulse sequences. The test pulse sequences are each ascertained on the basis of the stipulated test vehicle acceleration and on the basis of switching parameter default values for the respective solenoid control valve, and the test pulse sequences have actuation pulses and adjoining non-actuation pulses. During an actuation pulse an activation of the respective solenoid control valve and during a nonactuation pulse a deactivation of the respective solenoid control valve takes place. The method further includes actuating the respective solenoid control valve using the at least two test pulse sequences in order to cause at least two test (Continued)

braking operations, wherein the respective test pulse sequence causes an alteration of a braking pressure at a service brake.

25 Claims, 5 Drawing Sheets

(51) Int. Cl.
  *B60T 8/171* (2006.01)
  *B60T 15/02* (2006.01)
  *B60T 17/22* (2006.01)
  *G01P 3/00* (2006.01)
  *G01P 15/00* (2006.01)
  *G05B 13/02* (2006.01)
  *G05B 13/04* (2006.01)

(52) U.S. Cl.
  CPC .............. *B60T 17/221* (2013.01); *G01P 3/00* (2013.01); *G01P 15/00* (2013.01); *G05B 13/0265* (2013.01); *G05B 13/042* (2013.01); *B60T 2250/00* (2013.01); *B60T 2270/406* (2013.01)

(56) References Cited

U.S. PATENT DOCUMENTS

| | | | | |
|---|---|---|---|---|
| 6,019,442 | A * | 2/2000 | Zechmann | B60T 8/1766 303/155 |
| 6,082,835 | A * | 7/2000 | Brearley | B60T 8/00 303/112 |
| 6,318,820 | B1 * | 11/2001 | Usukura | B60T 8/1764 303/149 |
| 6,360,592 | B1 * | 3/2002 | Harris | B60T 8/4072 73/121 |
| 6,719,376 | B1 * | 4/2004 | Klein | B60T 8/00 303/15 |
| 6,814,414 | B1 * | 11/2004 | Schmitt | B60T 8/172 303/191 |
| 9,050,954 | B2 * | 6/2015 | Terasaka | B60T 13/662 |
| 9,248,815 | B2 * | 2/2016 | Griffin | B60T 13/662 |
| 9,434,364 | B2 * | 9/2016 | Terasaka | B60T 7/12 |
| 10,166,957 | B2 * | 1/2019 | Bach | B60T 8/175 |
| 11,084,468 | B2 * | 8/2021 | Hartl | B60T 13/662 |
| 2001/0037677 | A1 | 11/2001 | Holst et al. | |
| 2003/0127910 | A1 | 7/2003 | Frank | |
| 2009/0014672 | A1 * | 1/2009 | Schiemann | F02D 41/20 251/129.01 |
| 2014/0214299 | A1 | 7/2014 | Risse et al. | |
| 2019/0248350 | A1 * | 8/2019 | Wulf | B60T 13/683 |
| 2020/0055511 | A1 * | 2/2020 | Schwagmeyer | B60T 8/1708 |

FOREIGN PATENT DOCUMENTS

| | | | |
|---|---|---|---|
| DE | 102007019732 A1 | 12/2007 | |
| DE | 102011111862 A1 | 2/2013 | |
| DE | 102014006614 A1 | 11/2015 | |
| DE | 102017003782 A1 * | 10/2018 | ............ B60T 8/1708 |
| EP | 1142768 A2 | 10/2001 | |
| GB | 2320540 A * | 6/1998 | ............. B60T 8/268 |
| JP | S 62173366 A | 7/1987 | |
| JP | H 08104225 A | 4/1996 | |
| WO | WO 0192075 A1 | 12/2001 | |
| WO | WO 2015074736 A1 | 5/2015 | |

* cited by examiner

METHOD FOR TEACHING SWITCHING PARAMETERS OF A SOLENOID CONTROL VALVE IN A BRAKING SYSTEM OF A VEHICLE, AND BRAKING SYSTEM

CROSS REFERENCE TO RELATED APPLICATIONS

This application is a U.S. National Phase Application under 35 U.S.C. § 371 of International Application No. PCT/EP2018/057365, filed on Mar. 22, 2018, and claims benefit to German Patent Application No. DE 10 2017 003 784.1, filed on Apr. 20, 2017. The International Application was published in German on Oct. 25, 2018 as WO 2018/192737 under PCT Article 21(2).

FIELD

The invention relates to a method for teaching switching parameters of a solenoid control valve in a braking system of a vehicle and to a braking system having solenoid control valves that is suitable for performing the method.

BACKGROUND

Service brake systems are known as pneumatically or hydraulically operating systems that can use appropriate modulators to also modulate a particular braking pressure at brake cylinders of service brakes under electrical control. To this end, there is provision in the modulator arranged upstream of the respective brake cylinder of the respective service brake for solenoid control valves that can be used to build up a braking pressure in the respective brake cylinder on the basis of a control signal. An inlet valve in the form of a solenoid control valve can be used, to this end, to admit a supply pressure from a pressure medium supply to the brake cylinder in order to increase the braking pressure, or the brake cylinder can be bled via an outlet valve in the form of a solenoid control valve in order to reduce the currently effective braking pressure. By actuating the applicable solenoid control valve for a particular pulse duration, the braking pressure can be adjusted smoothly as a result. Such a solenoid control valve in a modulator is described in exemplary fashion in DE 10 2014 006 614 A1.

To coordinate the braking pressure actually built up in the brake cylinder with respect to manufacturing tolerances, multiple methods are known. First, tolerances can be detected for each solenoid control valve at the end of the production line and said tolerances can be compensated for by means of appropriate parameterization. This has the disadvantage that tolerances in the braking system of the vehicle in which such a solenoid control valve is installed, for example as a result of differently designed tubing or volumes of the brake cylinders, are not included and they therefore cannot be compensated for.

If there is provision for a pressure sensor on the modulators in which the solenoid control valves are installed, which measure a braking pressure actually modulated by the modulator, the pulse durations can be adapted accordingly and this also allows tolerances in the braking system of the vehicle to be compensated for in a followup learning process. If there is no such pressure sensor present in the modulator, however, as e.g. in the modulator according to DE 10 2014 006 614 A1, the followup learning process cannot be performed, because the actually modulated braking pressure is not known.

In other methods too, coordination of the respective solenoid control valve takes place while the vehicle is traveling. DE 195 10 933 A1, for example, shows a method for determining a response pressure of a service brake in a braking system having a solenoid control valve or having a modulator, for example in a trailer braking system and/or in a motor vehicle braking system. To this end, according to one alternative, when the service brake valve is unoperated, test braking operations are performed at a stipulated test braking pressure that is adjusted by actuating the solenoid control valve. Before the test braking is performed, a vehicle basic acceleration is detected and said acceleration is compared with a test vehicle acceleration obtained following modulation of the test braking pressure. If the test vehicle acceleration is equal to the vehicle basic acceleration, the test braking pressure has not exceeded the sought response pressure of the service brake, since the acceleration of the vehicle has not altered as a result of the test braking. If, after a gradual increase in the test braking pressure, the test vehicle acceleration for a particular test braking pressure is higher than the vehicle basic acceleration, the response pressure has been exceeded by the test braking pressure.

Therefore, the response pressure of the service brake can be ascertained, depending on the step size of the increase in the test braking pressure, within a particular tolerance by the test braking operations while the vehicle is traveling. According to a further alternative, the test braking can also be overlaid on normal braking, with the vehicle basic acceleration in the case before the normal braking and the test vehicle acceleration after termination of the normal braking being detected.

According to DE 10 2011 111 862 A1 and EP 1 142 768 A2, there is provision for test braking operations at low braking pressure to be used to ascertain a roll-critical transverse acceleration value of a vehicle. This involves evaluating how a test braking operation affects a speed of wheels on the inside of a curve, which push on the ground to a lesser extent when there is a tendency to overturn. The speed can be used to detect a wheel contact force and, by virtue of this, the roll-critical transverse acceleration value.

WO 01/92075A1 likewise describes ascertaining a response pressure of a service brake by means of test braking operations, wherein the speeds are used to establish whether the vehicle reacts to the test braking. If a reaction by the vehicle can be detected from a particular time onward in the event of a progressive increase in the braking pressure, the braking pressure effective at this time is stipulated as the response pressure of the respective service brake and used as a fixed parameter in the braking system.

SUMMARY

In an embodiment, the present invention provides a method for specifying switching parameters of a solenoid control valve in a braking system of a vehicle. The method includes stipulating a test vehicle acceleration; ascertaining at least two test pulse sequences, wherein the test pulse sequences are each ascertained on the basis of the stipulated test vehicle acceleration and on the basis of switching parameter default values for the respective solenoid control valve, and the test pulse sequences have actuation pulses and adjoining nonactuation pulses, wherein during an actuation pulse an activation of the respective solenoid control valve and during a nonactuation pulse a deactivation of the respective solenoid control valve takes place; actuating the respective solenoid control valve using the at least two test pulse sequences in order to cause at least two test braking operations, wherein the respective test pulse sequence causes an alteration of a braking pressure at a service brake of the braking system such that a change in the driving dynamics of the vehicle results; ascertaining driving dynamics change variables in order to detect the change in the driving dynamics of the vehicle as a result of the actuation using the respective test pulse sequence, and adapting the switching parameter default values for the solenoid control valve on the basis of the driving dynamics change variables in order to teach the switching parameters of the solenoid control valve.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

A disadvantage is that even if the response pressure of a service brake is known, it is not possible to make a statement about the switching parameters of a solenoid control valve in the modulators that is connected upstream of the service brakes. If such a solenoid control valve is upgraded or replaced or if there is a change in the switching parameters of the solenoid control valve on account of wear or on account of the environment, this can be detected, and accordingly adapted in a teaching process, in the prior art only by evaluating the actually modulated braking pressure. To this end, the actual braking pressure is regulated to the setpoint braking pressure by adapting the electrical actuation of the respective solenoid control valve by means of a control signal, for example.

If, for reasons of cost or for reasons of space, there is no pressure sensor downstream of the solenoid control valve, however, stipulating the control signal for actuating the respective solenoid control valve requires recourse to the parameterization performed at the end of the production line, for example. Said parameterization can easily deviate from the actual switching parameters on account of the surroundings or on the basis of the design of the current braking system, for example, however, which can lead to imprecise actuation of the service brakes, for example to unintentionally asymmetric actuation of service brakes at different wheels of a vehicle axle.

Embodiments of the invention specify a method for teaching switching parameters of a solenoid control valve that can be used to parameterize a solenoid control valve in a braking system in a simple and reliable manner. Furthermore, embodiments of the invention specify a braking system for performing such method.

According to the invention, there is accordingly provision for switching parameters of the solenoid control valve in a braking system of a vehicle, in particular a commercial vehicle, to be taught by ascertaining driving dynamics change variables resulting from at least two modulated test braking operation, and taking these driving dynamics change variables as a basis for adapting a switching parameter default value used for stipulating the test braking operations, and thereby teaching an approximately actually valid switching parameter that can be assumed to be reliable for electrically modulating subsequent braking operations using the relevant solenoid control valve.

This already achieves the advantage, according to the invention, that adaptation of the switching parameter default values of the relevant solenoid control valve can take place even without detecting a braking pressure by means of a pressure sensor and instead there is recourse to the direct reaction of the vehicle to the test braking operations. This reaction can be ascertained using sensors that are necessary, and present, in a vehicle anyway, for example speed sensors or longitudinal acceleration sensors, so that costs and space can be saved for the pressure sensor in the braking system.

The switching parameters can be, according to embodiments of the invention, periods of time specific to the respective solenoid control valve that characterize a switching delay, i.e. a period of time in which the solenoid control valve does not react after an electrical actuation and it is accordingly also not possible for a reaction of the vehicle, i.e. a change in the driving dynamics of the vehicle, to this actuation to be obtained. The switching parameter default values used in this case can be for example production-contingent estimated values from the end of the production line or previously taught switching parameters for the solenoid control valve.

The switching parameter can be for example a switched-on period indicating the period of time between actuation of the relevant solenoid control valve by means of an actuation pulse transmitted by means of a control signal and a resultant movement of a magnet armature that activates the relevant solenoid control valve and that can accordingly produce a particular reaction from the vehicle. Furthermore, the switching parameter denoted is a switched-off period indicating the period of time between the disappearance of the actuation pulse and the dropping-back of the for example spring-biased magnet armature, as a result of which the relevant solenoid control valve is deactivated and an appropriate reaction by the vehicle within the realms of the respective test braking can occur. Furthermore, the switching parameter can also be understood to be an arbitrary variable dependent on the switched-on period and the switched-off period, which variable likewise characterizes the switching delay of the solenoid control valve, for example also an overall switching period, which follows from a difference between the switched-on period and the switched-off period below.

The switching parameters can be taught in this case for solenoid control valves embodied as "normally closed" solenoid valves or "normally open" solenoid control valves. In a modulator modulating the braking pressure at service brakes of the vehicle, it is normal for this arrangement to have "normally closed" solenoid control valves as inlet valves and "normally open" solenoid control valves as outlet valves.

In order to teach the switching parameters for the inlet valves, said inlet valves can be used to prompt a change in the driving dynamics by means of at least two test braking operations. This is accomplished by activating the relevant inlet valve by means of an actuation using at least one actuation pulse, which opens the inlet valve and allows an increase in the braking pressure at the service brakes to take place. At the same time, it is necessary to ensure that the outlet valve arranged in the same modulator remains closed.

In order to teach the switching parameters for the outlet valves, said outlet valves likewise can be used to prompt a change in the driving dynamics by means of at least two test braking operations. This is accomplished by deactivating the relevant outlet valve, i.e. by means of a nonactuation by means of what is known as a nonactuation pulse. This means that the relevant outlet valve is not actuated for a particular period of time between actuation pulses and therefore remains in its normally open position, in which the braking pressure in the service brakes is reduced by bleeding and therefore a change in the driving dynamics can take place. At the same time, it is necessary to ensure that the inlet valves are deactivated in order to allow a controlled change in the driving dynamics.

With knowledge of a response pressure of the respective service brake, it is thus possible in particular for the cited switching parameters of the solenoid control valve to be ascertained directly from the change in the driving dynamics of the vehicle. Preferably, the test braking operations are performed to this end at a time at which no further braking requirements are implemented, so that it is possible to ensure that the reaction of the vehicle occurs only on account of the actuation or nonactuation of the respective solenoid control valve by means of which the test braking operations is triggered.

To modulate the at least two test braking operations, a test vehicle acceleration is first of all stipulated that is meant to be used to slow down the vehicle within the realms of the two test braking operations. So as not to disturb the driver and also not to obtain any nonlinear effects when evaluating the reaction of the vehicle, the test vehicle acceleration needs to be chosen to be small, but without dropping below the already known response pressure of the respective service brake in the process, since a reaction from the vehicle is required for teaching the switching parameters.

The test vehicle acceleration subsequently needs to be used to ascertain a test pulse sequence for each test braking operation, wherein each test pulse sequence has a certain number of actuation pulses and/or nonactuation pulses and the respective test pulse sequence is ascertained on the basis of the switching parameter default values for the relevant solenoid control valve. The respective test pulse sequence is used to subsequently actuate or not actuate the solenoid control valve, so that an alteration of the braking pressure and also a change in the driving dynamics of the vehicle result. This change in the driving dynamics is detected in the form of the driving dynamics change variable for each test pulse sequence, the driving dynamics change variable being able to be for example an actual vehicle acceleration or an actual speed change or a resultant slip change, which can be detected by means of the longitudinal acceleration sensor and/or the speed sensors in the vehicle. On the basis of this, the adaption of the switching parameter default values subsequently takes place.

Preferably, the switching parameter default values are in this case adapted only if the respective driving dynamics change variable is outside a tolerance band around an expected value for the respective driving dynamics change variable, wherein the expected value can be for example the respective test vehicle acceleration or a setpoint speed change or a setpoint slip change, each of which specifies the reaction of the vehicle that is to be expected on account of the respective test braking operation in a simple manner. These separate variables can be ascertained in a simple manner or are already known within the realms of the teaching process.

Preferably, there is provision for the test pulse sequences to be ascertained by virtue of a test pulse duration being stipulated for each actuation pulse of the test pulse sequence and/or by virtue of a test pause duration being stipulated for each nonactuation pulse of the test pulse sequence, each of which is dependent on the number of actuation pulses or nonactuation pulses per test pulse sequence and on the stipulated test vehicle acceleration and also on the switching parameter default values. In this case, the test pulse duration indicates the duration of each of the actuation pulses and the test pulse duration indicates the duration of each of the nonactuation pulses of the respective test pulse sequence.

The test pulse duration for the respective test pulse sequence is dependent on an effective test activation period in this case, the effective test activation period indicating the period of time for which the solenoid control valve needs to be transferred to its activated position in order to cause an alteration of the braking pressure at the service brake such that the stipulated test vehicle acceleration is also implemented. This is relevant for the teaching process for the inlet valve ("normally closed"), in particular. This effective test activation period together with a switched-on period default value and a switched-off period default value for the relevant solenoid control valve or inlet valve prescribes the test pulse duration to be modulated by means of a control signal for every actuation pulse.

Accordingly, the test pause duration for the respective test pulse sequence is dependent on an effective test deactivation period, the effective test deactivation period indicating the period of time for which the solenoid control valve needs to be transferred to its deactivated position in order to cause an alteration of the braking pressure at the service brake such that the stipulated test vehicle acceleration is also implemented. This is relevant for the teaching process for the outlet valve ("normally open"), in particular. This effective test deactivation period together with a switched-on period default value and a switched-off period default value for the relevant solenoid control valve or outlet valve prescribes the test pause duration to be modulated by means of the control signal for every nonactuation pulse.

Preferably, the effective test activation period and test deactivation period are to this end ascertained for the stipulated test vehicle acceleration from a characteristic curve indicating the relationship between the two by taking into consideration the known response pressure of the respective service brake. This allows simple and reliable conversion to be ensured.

If there is provision for multiple actuation pulses or nonactuation pulses for every test pulse sequence, the effective test activation period or test deactivation period for determining the test pulse duration or test pause duration for each actuation pulse or nonactuation pulse preferably needs to be split over the number of actuation pulses or nonactuation pulses, and the switching parameter default values for each actuation pulse or nonactuation pulse needs to be fully taken into consideration. This advantageously also allows a pulse-width-modulated actuation by means of multiple actuation pulses or nonactuation pulses to take place in order to cause the respective test braking operation.

According to embodiments of the invention, there is preferably provision for a first test pulse sequence comprising a first number of actuation pulses and/or nonactuation pulses for performing a first test braking operation and at least a second test pulse sequence comprising a second number of actuation pulses and/or nonactuation pulses for performing at least a second test braking operation to be ascertained and accordingly for at least two test braking operations to be performed, the same test vehicle acceleration being set for each test braking operation or each test pulse sequence, so that the effective test activation period or test deactivation period is also identical for each test braking operation.

So that the at least two test braking operations do not influence one another, the at least two test pulse sequences are modulated with staggered timing, preferably in succession if the driving situation so permits. The at least two test braking operations can in this case be performed on a wheel-by-wheel basis at the same solenoid control valve or on an axle-by-axle basis at the same solenoid control valves or at different solenoid control valves that are each associated with different service brakes on a vehicle axle of the vehicle.

If the at least two test braking operations are performed on a wheel-by-wheel basis at the same solenoid control valve or on an axle-by-axle basis at the same solenoid control valves, the number of actuation pulses or nonactuation pulses needs to be chosen differently for each test braking operation. In that case, adapting of the switching parameter default values takes place only if a first driving dynamics change variable from the first test braking operation differs from a second driving dynamics change variable from the second test braking operation by more than a threshold value. This ensures that an adaptation takes place only if there is a deviation from the expectation that both test braking operations cause approximately the same reaction by the vehicle, since the test vehicle acceleration for the two test braking operations are identical. This can be achieved in a simple manner as a result of comparing and setting a threshold value.

If an adaptation of the switching parameter default values is necessary on the basis of the exceeding of the threshold value, said adaptation preferably takes place on the basis of a difference between the at least two ascertained driving dynamics change variables and/or on the basis of a difference between currently ascertained effective actual activation periods or effective actual deactivation periods, wherein the effective actual activation periods or actual deactivation periods follow from the at least two driving dynamics change variables and in this case each indicate the period of time for which the relevant solenoid control valve is transferred to its activated or deactivated position in order to cause the respective driving dynamics change variable. In this case, the difference in the number of actuation pulses or nonactuation pulses between the two test braking operations is also taken into consideration.

A simple and reliable method is therefore used to work backwards to calculate which switching parameters fit the current reaction of the vehicle to the test braking operations, this advantageously being effected by detecting the difference in the respective reactions of the vehicle in the form of a difference formation. Since both test braking operations are performed using different pulse sequences or test pause durations, but the same switching parameters apply to both test braking operations, this results in the present value for the switching parameters in a simple manner. The difference formation furthermore has the advantage that ambient influences, which affect both test braking operations approximately identically, fall by the wayside and can therefore be ignored.

Since both test braking operations are performed at the same solenoid control valve, there are two opportunities for creating equal initial conditions and thereby avoiding nonlinear effects. Either the braking pressure is set to a predefined value before each test braking operation or else the braking pressure effective before a test braking operation is estimated or measured and included in the analysis of the driving dynamics change variable for adapting the switching parameter default values. The predefined value in this case can be provided by the atmospheric pressure in the case of an inlet valve, i.e. the brake cylinders are bled before each test braking operation. In the case of an outlet valve, however, only bleeding can cause a change in the driving dynamics, which means that a particular braking pressure needs to be set before a test braking operation using the outlet valve.

The braking system on which the method is based can be embodied in particular as an electropneumatic braking system, in which a control device can be used to adjust braking pressures under electrical control. The solenoid control valves for which the switching parameters are to be taught are arranged in modulators connected upstream of the service brakes and are embodied as an inlet valve and outlet valves, for example, which allow an increase of pressure or a reduction of pressure in the brake cylinders as described. The control device outputs control signals that transmit the test pulse sequences and modulate them for the relevant solenoid control valves in the modulator, so that said solenoid control valves have a control voltage applied to them or do not have a control voltage applied to them in accordance with the actuation pulses or nonactuation pulses of the test pulse sequence. The actuation in this case can preferably be effected on a wheel-by-wheel or axle-by-axle basis, in order to be able to carry out the method with the applicable test braking operations. Therefore, a pressure sensor is not needed in the braking system at least for performing the method and hence for teaching the switching parameters.

Figure 1:
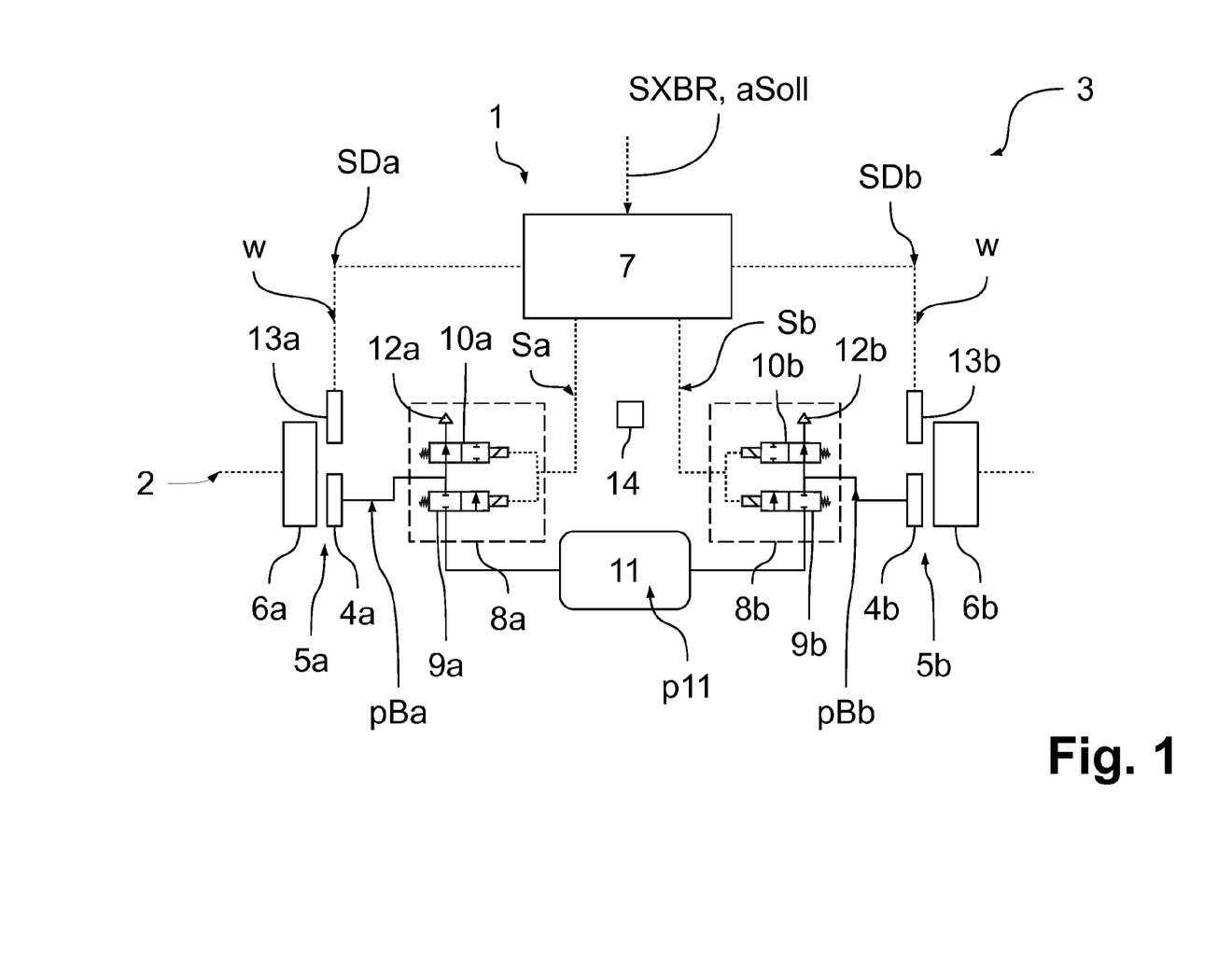
FIG. 1 shows a schematic view of a braking system in the region of a rear axle of a vehicle.

FIG. 1 shows a detail from a braking system 1 in the region of a rear axle 2 of a vehicle 3 in exemplary fashion and schematically, the braking system 1 according to this embodiment being embodied as a pneumatic braking system. Accordingly, by building up a braking pressure pBa, pBb in brake cylinders or brake chambers 4a, 4b of service brakes 5a, 5b, the respective wheels 6a, 6b on the rear axle 2 can be deliberately slowed down. The indices "a" and "b" in this case distinguish the wheel side on the rear axle 2, "a" representing the left-hand side and "b" representing the right-hand side.

The braking pressure pBa, pBb in the service brakes 5a, 5b on the rear axle 2 is prescribed electropneumatically by virtue of a control device 7 of the braking system 1 actuating modulators 8a, 8b upstream of the respective service brakes 5a, 5b using a control signal Sa, Sb. According to the embodiment in FIG. 1, each modulator 8a, 8b has in each case one inlet valve 9a, 9b and one outlet valve 10a, 10b, which are each embodied as solenoid control valves or solenoid valves and which can be individually actuated by means of the control signal Sa, Sb.

Actuation of the respective solenoid control valve 9a, 9b, 10a, 10b for a pulse duration tOn transfers said solenoid control valve to its activated position, to which end a voltage is prescribed for the respective solenoid control valve 9a, 9b, 10a, 10b for the pulse duration tOn, said voltage causing a flow of current in a solenoid of the respective solenoid control valve 9a, 9b, 10a, 10b and, on the basis thereof, a movement of a spring-biased magnetic armature to activate the solenoid control valve 9a, 9b, 10a, 10b.

In this case, the solenoid control valves 9a, 9b, 10a, 10b can be embodied as "normally closed" valves, i.e. without activation the solenoid control valves 9a, 9b, 10a, 10b are put into the closed position, or as "normally open" valves, i.e. without activation of the solenoid control valves 9a, 9b, 10a, 10b are transferred to the open position. In the exemplary embodiments that follow, the inlet valves 9a, 9b are embodied as "normally closed" valves, i.e. in order to open or activate the inlet valves 9a, 9b, the latter need to be actuated for a certain pulse duration tOn. The outlet valves 10a, 10b, on the other hand, are embodied as "normally open" valves, i.e. in order to close or activate the outlet valves 10a, 10b, the latter likewise need to be actuated for a certain pulse duration tOn. Without actuation, the outlet valves 10a, 10b are accordingly put into the open position and the inlet valves 9a, 9b are put into the closed position, the period of time in which no actuation takes place being referred to as the pulse duration tOff below.

Accordingly, the prescribing of an appropriate control signal Sa, Sb allows the inlet valve 9a, 9b and/or the outlet valve 10a, 10b of the respective modulator 8a, 8b to be activated or deactivated individually for a particular period of time and, as a result, the braking pressure pBa, pBb to be adjusted accordingly. For the sake of clarity, distinction between the wheel sides and the respective solenoid control valves 9a, 9b, 10a, 10b by means of an index is dispensed with below for the periods of time under consideration. The periods of time under consideration are ascertained and stipulated individually for each solenoid control valve 9a, 9b, 10a, 10b on its own, however.

The inlet valve 9a, 9b is connected by means of a supply line to a pressure medium supply 11 storing a pressure medium at a supply pressure p11. Opening the inlet valve 9a, 9b allows the pressure medium to flow from the pressure medium supply 11 into the brake cylinder 4a, 4b of the respective service brake 5a, 5b and, as a result, a particular braking pressure pBa, pBb to be built up at the service brake 5a, 5b depending on the pulse duration tOn for the relevant inlet valve 9a, 9b. The outlet valve 10a, 10b has a flow connection to a bleed connection 12a, 12b, the bleed connection 12a, 12b in turn leading into the atmosphere, so that the respective brake cylinder 4a, 4b can be bled when the outlet valve 10a, 10b is open, i.e. deactivated, and the braking pressure pBa, pBb can therefore be reduced depending on the pause time tOff for the relevant outlet valve 10a, 10b.

Therefore, appropriately prescribing the pulse duration tOff and the pause duration tOff for the relevant solenoid control valves 9a, 9b, 10a, 10b allows the braking pressure pBa, pBb to be maintained (outlet valves 10a, 10b activated and inlet valves 9a, 9b deactivated), increased (outlet valves 10a, 10b activated and inlet valves 9a, 9b activated) and reduced (outlet valves 10a, 10b deactivated and inlet valves 9a, 9b deactivated).

The prescribing of the pulse duration tOn and of the pulse duration tOff for the relevant solenoid control valves 9a, 9b, 10a, 10b, and hence of the braking pressure pBa, pBb to be set at the respective wheel side of the rear axle 2, by means of the respective control signal Sa, Sb is effected by means of the control device 7. The latter can prescribe the control signals Sa, Sb, for example within the realms of brake slip control, on the basis of a speed sensor signal SDa, SDb provided by a speed sensor 13a, 13b on the respective wheel side, and/or on the basis of an externally transmitted XBR signal SXBR that is output by an arbitrary driving assistance system in the vehicle 2 and for example transmits a setpoint vehicle acceleration aSoll to be set by the braking system 1 in the form of a deceleration request.

The control device 7 takes these signals SDa, SDb, SXBR as a basis for individually prescribing pulse durations tOn and pulse durations tOff for the applicable solenoid control valve 9a, 9b, 10a, 10b in order to adjust the braking pressures pBa, pBb and hence implement the requirements according to a particular control strategy.

In order to allow precise implementation of the respective requirement, the control device 7 needs to take into consideration switching parameters or switching periods that prescribe a switching characteristic for each of the solenoid control valves 9a, 9b, 10a, 10b and that are each included in the estimation or calculation of what pulse duration tOn or what pulse duration tOff is approximately consistent with what braking pressure pBa, pBb to be modulated and hence with what setpoint vehicle acceleration aSoll. The switching parameters are understood in this case to mean in particular a switched-on period tE and a switched-off period tA of the respective solenoid control valve 9a, 9b, 10a, 10b, which indicate a switching delay at the respective solenoid control valve 9a, 9b, 10a, 10b, i.e. a period of time in which, although the respective control signal Sa, Sb is used to request a change in the switching state of the respective solenoid control valve 9a, 9b, 10a, 10b, the latter does not react to this request and the change in the driving dynamics of the vehicle 3 therefore remains unaltered despite an actuation.

Figure 2A:
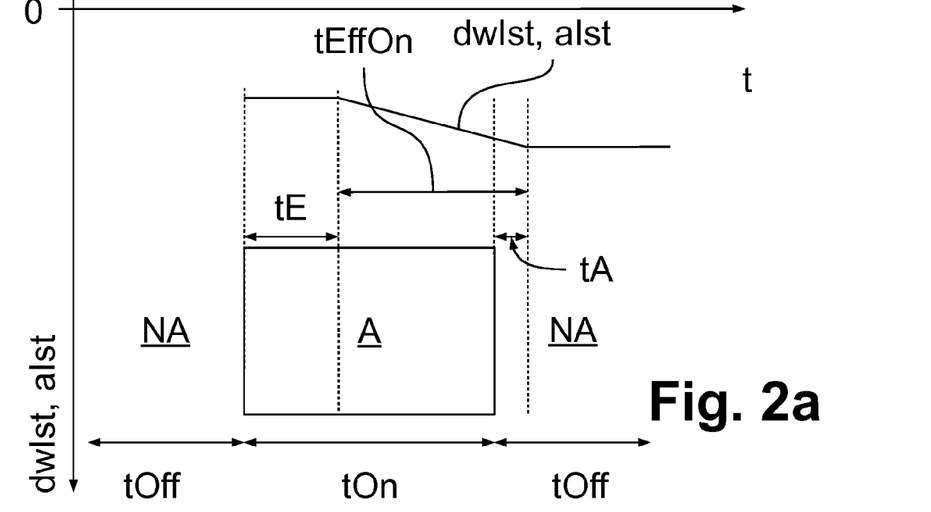
FIGS. 2a and b show actuation pulses and nonactuation pulses for actuating an inlet valve and an outlet valve of the braking system shown in FIG. 1.
Figure 2B:
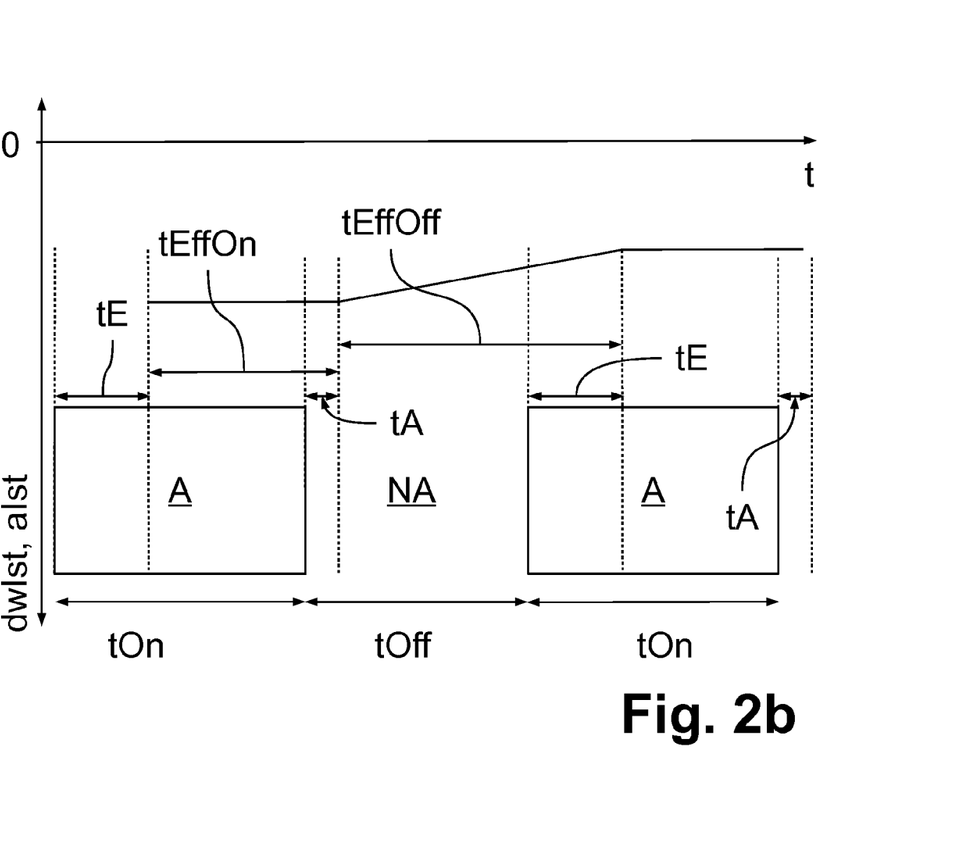

FIGS. 2a and 2b depict, in exemplary fashion, actuation pulses A having a certain pulse duration tOn that are output by means of the control signal Sa, Sb and adjoining pauses or what is known as nonactuation pulses NA, in which no actuation takes place for a certain pause time tOff, and also the applicable switching parameters tE, tA for an inlet valve 9a, 9b (2a) and an outlet valve 10a, 10b (2b) of an arbitrary modulator 8a, 8b.

Furthermore, figures FIGS. 2a and 2b show the reaction of the vehicle 3 to these actuations and nonactuations and in this case specifically a change in the driving dynamics of the vehicle 3 in the form of a time characteristic for an actual speed change dwIst, which indicates the change in a speed w, measured by the speed sensors 13a, 13b, of the wheels 6a, 6b of the vehicle 3 per interval of time and hence a variable proportional to an actual vehicle acceleration aIst. Therefore, the figures merely depict a qualitative characteristic for the change in the driving dynamics.

The switched-on period tE in this case indicates the period of time after an actuation by means of the respective control signal Sa, Sb, i.e. after the buildup of a voltage at a control input of the applicable solenoid control valve 9a, 9b, 10a, 10b, after which said solenoid control valve changes to its activated position. In this case, the switched-on period tE is influenced by how quickly after the voltage is applied on account of the control signal Sa, Sb a solenoid present in the solenoid control valve 9a, 9b, 10a, 10b sets up a magnetic field and the latter moves a spring-biased magnetic armature counter to a spring force in order to activate the solenoid control valve 9a, 9b, 10a, 10b.

In the case of an inlet valve 9a, 9b, the effect accordingly achieved is that—as depicted in FIG. 2a—expiry of the switched-on period tE is followed by the actual speed change dwIst or the actual vehicle acceleration aIst becoming smaller during an actuation for the pulse duration tOn, because the vehicle 3 is slowed down to a greater extent from that point onward by the actual opening of the inlet valve 9a, 9b on account of an activation, wherein the actual vehicle acceleration aIst and also the actual speed change dwIst are negative on the basis of the slowing-down, i.e. the absolute value of the actual vehicle acceleration aIst and also the absolute value of the actual speed change dwIst rise. In this case, it is assumed that the outlet valve 10a, 10b in the same modulator 8a, 8b is activated or remains activated at the same time, so that the pressure medium streaming in ensures a rise in the braking pressure pBa, pBb in the respective brake cylinder 4a, 4b on account of the activation of the inlet valve 9a, 9b, i.e. an increase of pressure in the respective brake cylinder 4a, 4b is requested.

In the case of an outlet valve 10a, 10b, on the other hand, expiry of the switched-on period tE is followed by the actual speed change dwIst or the actual vehicle acceleration aIst remaining constant—as shown in FIG. 2b—during an actuation for the pulse duration tOn, because the braking pressure pBa, pBb in the respective braking cylinder 4a, 4b is no longer altered from that point onward by the actual closing of the outlet valve 10a, 10b on account of the activation and the vehicle is therefore slowed down at constant actual vehicle acceleration aIst. This occurs on the assumption that the inlet valve 9a, 9b in the same modulator 8a, 8b is or remains deactivated at the same time, i.e. a maintenance of pressure in the respective brake cylinder 4a, 4b is requested.

In a manner comparable to the switched-on period tE, the switched-off period to of the respective solenoid control valve 9a, 9b, 10a, 10b is prescribed by how long the respective solenoid control valve 9a, 9b, 10a, 10b remains activated after the voltage by means of the control signal Sa, Sb disappears and the magnetic field in the solenoid dissipates, so that the spring-biased magnetic armature drops back again as a result of the spring force. In the case of conventional solenoid control valves 9a, 9b, 10a, 10b, the absolute value of the switched-on period tE is different than the absolute value of the switched-off period tA, preferably the switched-on period tE has a higher absolute value than the switched-off period tA.

In the case of an inlet valve 9a, 9b, the effect achieved, as shown in FIG. 2a, after expiry of the switched-off period tA is that the actual speed change dwIst or the actual speed acceleration aIst remains constant, since the inlet valve 9a, 9b is not actually closed until the switched-off period tA expires, i.e. no further braking pressure buildup occurs and the vehicle 3 is therefore slowed down at constant actual vehicle acceleration aIst. In this case, it is again assumed that the outlet valve 10a, 10b in the same modulator 8a, 8b is or remains activated at the same time, i.e. a maintenance of pressure in the brake cylinders 4a, 4b is requested.

In the case of an outlet valve 10a, 10b, on the other hand, the effect achieved, as shown in FIG. 2b, after expiry of the switched-off period tA is that the actual speed change dwIst or the actual vehicle acceleration aIst increases in the direction of zero, or decreases in terms of absolute value, since the outlet valve 9a, 9b is not actually opened until after expiry of the switched-off period tA, i.e. a simultaneously deactivated inlet valve 9a, 9b results in the braking pressure pBa, pBb in the brake cylinders 4a, 4b being drained off to the bleed connection 12a and therefore decreased and the vehicle 3 thereby being slowed down to a lesser extent.

Both periods of time tE, tA thus contribute to the pulse duration tOn requested by means of the control signal Sa, Sb and the pulse duration tOff between the actuation pulses A not being consistent with the period of time in which the respective solenoid control valve 9a, 9b, 10a, 10b is actually in its activated or deactivated position and in which an unintentional maintenance of pressure, buildup of pressure or a reduction of pressure can therefore continue to take place.

The respective solenoid control valve 9a, 9b, 10a, 10b accordingly remains actually activated for a period of time referred to as effective activation period tEffOn below in the event of a certain pulse duration tOn prescribed by means of the control signal Sa, Sb, the effective activation period tEffOn being obtained from tEffOn=tOn−tE+tA. Analogously, the respective solenoid control valve 9a, 9b, 10a, 10b remains actually deactivated for a period of time referred to as effective deactivation period tEffOff below in the event of a certain pause duration tOff between two actuation pulses A being prescribed, the effective deactivation period tEffOff being obtained from tEffOff=tOff−tA+tE.

The two switching periods tE, tA of a particular solenoid control valve 9a, 9b, 10a, 10b are also combined in an overall switching period P=tE−tA below, which indicates the period of time in which although the respective solenoid control valve 9a, 9b, 10a, 10b reacts during an actuation pulse A (switching on and switching off), no change in the driving dynamics of the vehicle 3 results. Therefore, the effective switching periods tEffOn, tEffOff can also be described by: tEffOn=tOn−P and tEffOff=tOff+P respectively.

The arithmetic sign of the overall switching period P results in this case from the effective activation period tEffOn being shortened by the switched-on period tE and extended by the switched-off period tA. This applies accordingly conversely for the deactivation period tEffOff. The overall switching period P can also be stored as a switching parameter in the control device 7.

For exact adjustment of the braking pressure pBa, pBb or of a prescribed setpoint vehicle acceleration aSoll, it is thus critical for these periods of time tE, tA, tEffOn, tEffOff, P to be determined or known as accurately as possible for each of the solenoid control valves 9a, 9b, 10a, 10b in the modulators 8a, 8b and accordingly stored as switching parameters in the control device 7. Since the switched-off period tA and the switched-on period tE can change depending on the environment and can also turn out different for each solenoid control valve 9a, 9b, 10a, 10b or in each braking system 1 depending on tolerances, however, correspondingly accurate parameterization is required on the control device 7.

In this regard, different embodiments are used below to describe a method for estimating these switching periods tE, tA or switching parameters that can be performed in the control device 7 while travelling and is used to teach the switching parameters tE, tA for individual solenoid control valves 9a, 9b, 10a, 10b in order to improve the accuracy of electropneumatically performed braking. To this end, the control device 7 performs one or more test braking operations in a coordinated manner by actuating the relevant solenoid control valves 9a, 9b, 10a, 10b, preferably on an axle-by-axle basis, said test braking operations being able to be inserted before a braking operation requested externally by means of the XBR signal SXBR, for example, so as not to disturb the driver. If it is accordingly detected in the control device 7 that the XBR signal SXBR has been used to request a particular setpoint vehicle acceleration aSoll externally, a pulse duration tOn corresponding to this setpoint vehicle acceleration aSoll and hence also pause durations tOff following therefrom are output by means of the control signal Sa, Sb only after a delay, for example by 100 ms, to the respectively relevant solenoid control valve 9a, 9b, 10a, 10b in the respective modulator 8a, 8b to implement the setpoint vehicle acceleration aSoll.

This delayed output of the externally requested braking allows a test braking operation using the applicable solenoid control valves 9a, 9b, 10a, 10b to be inserted by means of the control signal Sa, Sb. To cause such a test braking operation, at least one of the solenoid control valves 9a, 9b, 10a, 10b is actuated using a first test pulse sequence PF1. To this end, a test vehicle acceleration aTest is first of all stipulated that is intended to be used to perform the test braking operation. Subsequently, an effective test activation period tEffOnTest or an effective test deactivation period tEffOffTest is read for this stipulated test vehicle acceleration aTest from a characteristic curve that takes into consideration in particular a response pressure of the respective service brake 5a, 5b, said periods indicating the periods of time for which the respective solenoid control valve 9a, 9b, 10a, 10b to be tested needs to be activated or deactivated in order to modulate a particular braking pressure pBa, pBb in the brake cylinders 4a, 4b and thereby to cause the test vehicle acceleration aTest.

The effective test periods of time tEffOnTest, tEffOffTest are thus stipulated such that, as described above, an increase of pressure or a reduction of pressure takes place in the brake cylinders 4a, 4b and accordingly a change in the driving dynamics is caused. As part of the test braking operation, the actual change in the driving dynamics is subsequently evaluated in order to ascertain the actually available switching parameters tA, tE therefrom.

In order to achieve activation of the respective solenoid control valve 9a, 9b, 10a, 10b for the ascertained effective test activation period tEffOnTest, the respective solenoid control valve 9a, 9b, 10a, 10b—as described above—needs to be actuated in the first test pulse sequence PF1 using a first test pulse duration tOn1, which is obtained from $$tOn1 = tEffOnTest + tE0 - tA0 = tEffOnTest + P0.$$

The switched-on period tE used in this case is a switched-on period default value tE0 and the switched-off period tA used in this case is a switched-off period default value tA0, and the overall switching period P used is an overall switching period default value P0, these default values tE0, tA0, P0 being stored on the control device 7 and either following from a prior teaching process or being based on production-contingent estimated values.

This applies accordingly to deactivation of a solenoid control valve 9a, 9b, 10a, 10b to be tested, wherein the respective solenoid control valve 9a, 9b, 10a, 10b—as described above—does not need to be actuated during a first test pause duration tOff1, in order to achieve the effective test deactivation period tEffOffTest:

$$tOff1 = tEffOffTest - tE0 + tA0 = tEffOffTest - P0$$

If there is provision in one or in multiple test braking operations for the switching periods tE, tA of one or more inlet valves 9a, 9b to be estimated using a method according to the invention, said inlet valve needs to be actuated using the first test pulse duration tOn1, since a change in the driving dynamics results only if the respective inlet valve 9a, 9b is activated. The outlet valve 10a, 10b in the same modulator 8a, 8b likewise remains activated in that case in order to allow an increase of pressure and hence the change in the driving dynamics.

If, however, there is provision in one or in multiple test braking operations for the switching periods tE, tA of one or more outlet valves 10a, 10b to be estimated using a method according to the invention, said outlet valve does not need to be actuated during the first test pause duration tOff1, since change in the driving dynamics results only if the respective outlet valve 10a, 10b is activated. The inlet valve 9a, 9b in the same modulator 8a, 8b remains deactivated in that case in order to allow a reduction of pressure and hence the change in the driving dynamics. In that case, however, it is necessary to ensure that a certain braking pressure pBa, pBb is built up in the brake cylinders 4a, 4b before the test braking operation in order to allow a reduction of pressure.

Following stipulation of the applicable parameters and variables for the test braking operation, the respective solenoid control valve 9a, 9b, 10a, 10b to be tested is thus actuated by means of the control signal Sa, Sb having the first test pulse sequence PF1 and subsequently the reaction of the vehicle 3 to the test braking operation is evaluated by virtue of a particular first driving dynamics change variable being captured. Preferably, the test braking operation is performed on an axle-by-axle basis in this case, i.e. the test braking operation is caused by virtue of the inlet valves 9a, 9b and/or the outlet valves 10a, 10b in both modulators 8a, 8b e.g. on the rear axle 2 being actuated at the same time, there being provision, according to a method according to an embodiment of the invention that is described below, for this to be achieved by modulating the same first test pulse sequence PF1 on both sides.

Figure 3A:
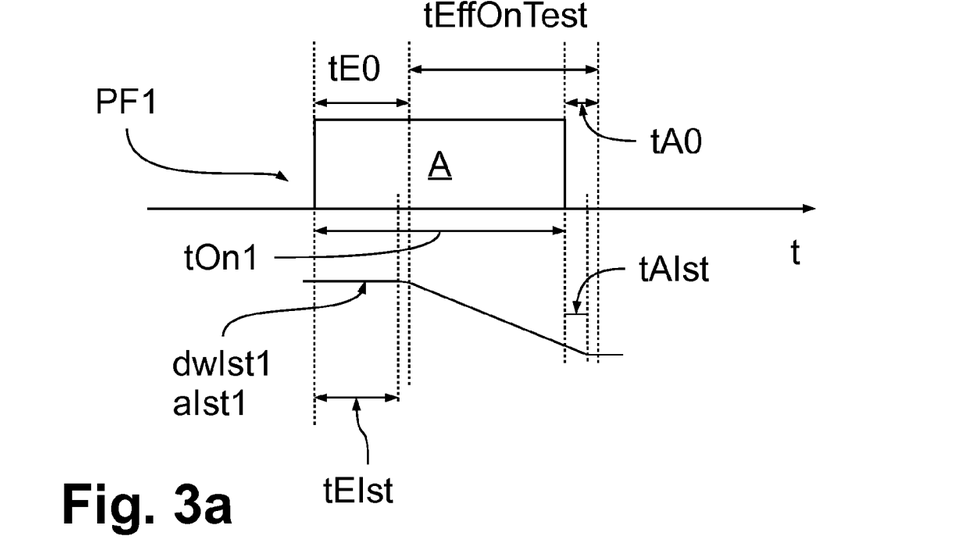
FIGS. 3a and b show a test pulse sequence for an inlet valve and an outlet valve for performing a test braking operation.
Figure 3B:
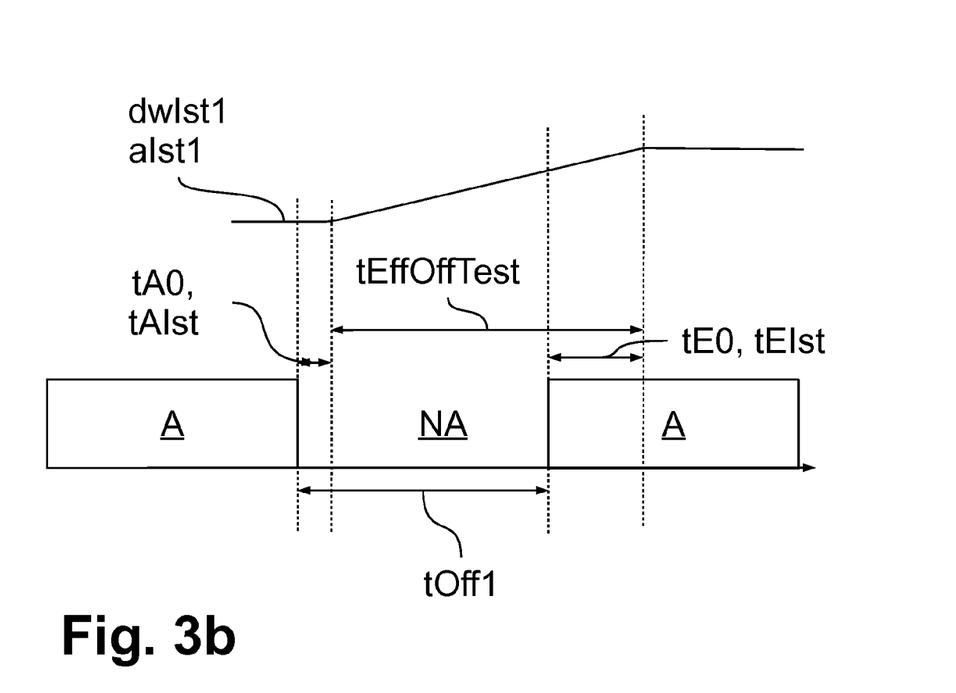

In the simplest form, it is assumed in this case for the two inlet valves 9a, 9b to be tested in the modulators 8a, 8b on the rear axle 2 (FIG. 1) that the first test pulse sequence PF1 has just one actuation pulse A (first number C1=1) and the change in the driving dynamics of the vehicle 3 is detected and evaluated only on the basis of this one actuation pulse A, as depicted in 3a. If the two solenoid control valves to be tested are the outlet valves 10a, 10b in the modulators 8a, 8b of the rear axle 2, a braking pressure pBa, pBb is first of all built up in the brake cylinders 4a, 4b, or an already existing braking pressure pBa, pBb is retained e.g. in a pressure maintenance phase and the two outlet valves 10a, 10b are subsequently deactivated for a defined first test pause duration tOff1 and subsequently reactivated, so that, as depicted in 3b, a nonactuation pulse NA is produced. The change in the driving dynamics is thus detected and evaluated only as a result of a single (C1=1) first test pause duration tOff1 between two actuation pulses A.

The first driving dynamics change variable characterizing the change in the driving dynamics as a result of the first test pulse sequence PF1 can be provided in this case by an actually present first actual vehicle acceleration aIst1, which is either measured directly by means of a longitudinal acceleration sensor 14 of the vehicle 3 or else calculated from the speed sensor signals SDa, SDb of the speed sensors 13a, 13b. To this end, a first actual speed change dwIst1 can be ascertained from the progression over time or the change in a first speed w1 obtained at an arbitrary wheel 6a, 6b of the vehicle 3 during the test braking operation in a time interval, and the first actual vehicle acceleration aIst1 can be ascertained from said first actual speed change. Alternatively, later on in the process, the first actual speed change dwIst1 can also be used directly as a first driving dynamics change variable or a variable proportional thereto, since this variable also characterizes the reaction of the vehicle 3 to the test braking operation.

An evaluation of the first driving dynamics change variable aIst1, dwIst1 captured by means of the sensors 13a, 13b, 14 therefore permits a direct reaction by the vehicle 3 to the test braking operation to be detected and hence the influence of the first test pulse sequence PF1 on the vehicle 3 to be estimated. As shown in exemplary fashion in FIG. 3a, an actuation of the two inlet valves 9a, 9b accordingly results in there being a switched-on period actual value tEIst for the respective inlet valve 9a, 9b that differs from the switched-on period default value tE0, wherein the switched-on period actual value tEIst indicates the actual value of the switched-on period tE of the respective inlet valve 9a, 9b for the test braking operation just performed. A switched-off period actual value tAIst likewise differs slightly from the switched-off period default value tA0.

FIG. 3b depicts the actuation of the two outlet valves 10a, 10b for the first test pulse sequence PF1 by means of two actuation pulses A, the first test pause duration tOff1 being obtained between the two actuation pulses A, which test pause duration, on the assumption of the switched-on period/switched-off period default values tA0, tE0 shown, causes a reaction by the vehicle 3 for which it can be assumed that the actual values tAIst, tEIst are concordant with the default values tA0, tE0.

Since an exact temporal association for the actual values tEIst, tAIst depicted in FIGS. 3a and 3b is too inaccurate on account of external influences and hence a direct comparison with the default values tE0, tA0 is not possible with sufficient accuracy, a check to determine whether the default values tE0, tA0, P0 (switching parameter default values) for the respective solenoid control valve 9a, 9b, 10a, 10b have been assumed correctly or need to be adapted can be effected by virtue of a second test braking operation being performed using a second test pulse sequence PF2 at the same wheel 6a, 6b as the first test braking operation used in the first test pulse sequence PF1. Accordingly, both inlet valves 9a, 9b or outlet valves 10a, 10b on the rear axle 2 are preferably first of all actuated at the same time using the first test pulse sequence PF1 and subsequently both inlet valves 9a, 9b or outlet valves 10a, 10b are actuated at the same time using the second test pulse sequence PF2, the test pulse sequences PF1, PF2 differing in that case. Fundamentally, however, it is also possible for the two test pulse sequences PF1, PF2 to be modulated in succession on only one wheel 6a, 6b of the rear axle 2.

Such a performance of the two test braking operations allows not only the time of the pressure buildup of the switched-on period tE or the switched-off period to of the respective solenoid control valve 9a, 9b, 10a, 10b to be checked, but also the absolute value of the modulated setpoint vehicle acceleration aSoll. This means that it is possible to check whether a pulse duration tOn or pause duration tOff ascertained using the switching parameter default values tE0, tA0, P0 can actually lead to the requested setpoint vehicle acceleration aSoll.

In the event of there being externally requested braking, the second test braking operation can be inserted in this case, depending on the delay in the output of the control signal Sa, Sb for delayed implementation of this externally requested braking, directly after the conclusion of the first test braking operation and before the performance of the braking requested externally by means of the XBR signal SXBR, or else at the next possible time, for example before further externally requested braking.

Figure 4:
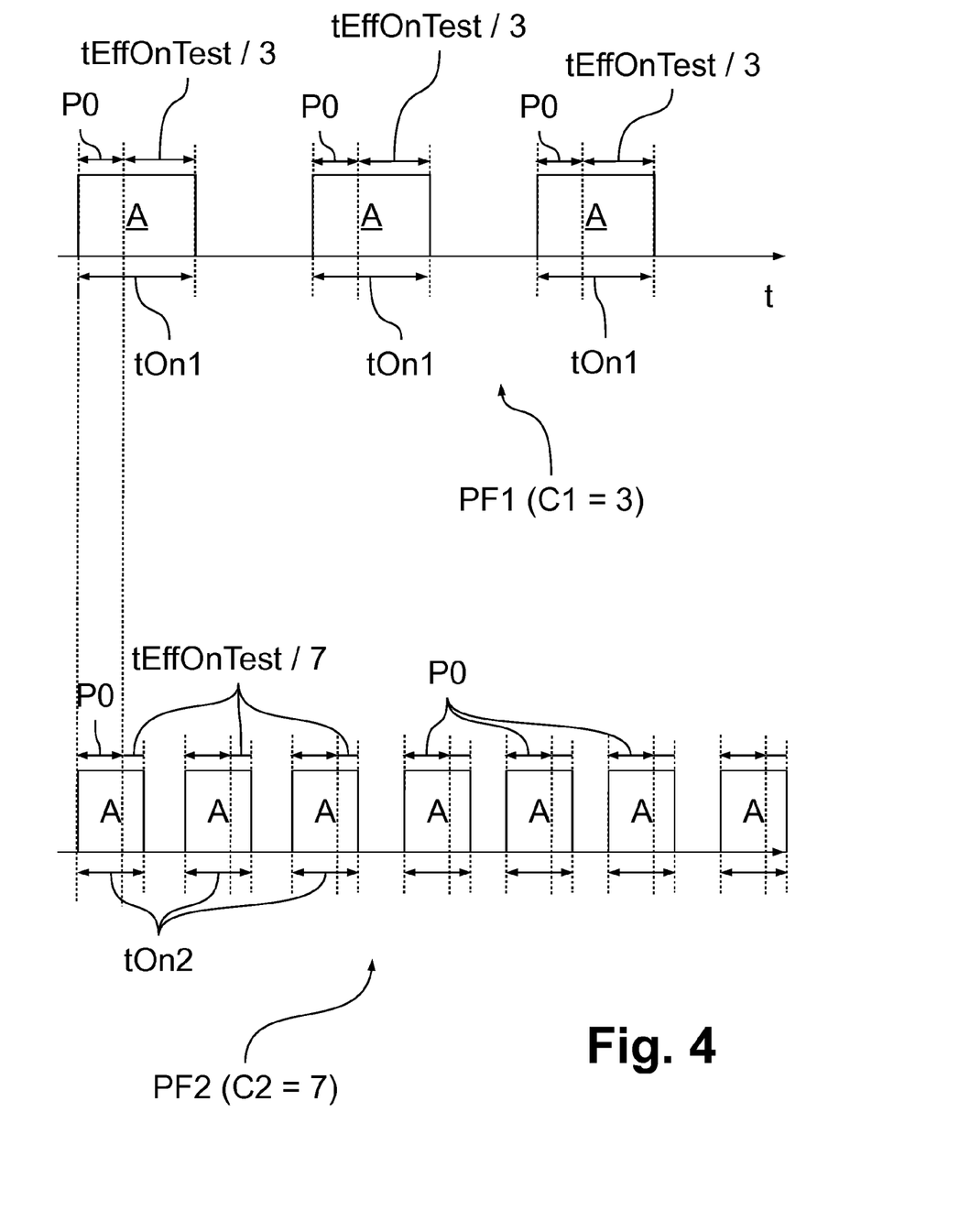
FIG. 4 shows two test pulse sequences for performing two successive test braking operations.

FIG. 4 depicts this on the basis of two test pulse sequences PF1, PF2, which are modulated at both inlet valves 9a, 9b of the rear axle 2 for implementation by the service brakes 5a, 5b. Analogously, this approach is also transferrable to the outlet valves 10a, 10b in order to perform such a testing operation therewith. The test pulse sequences PF1, PF2 are stipulated as follows:

First of all, as above, a value for the test vehicle acceleration aTest is stipulated that applies to both test pulse sequences PF1, PF2. From the simulated test vehicle acceleration aTest, there follows, as described above, from a characteristic curve an effective test activation period tEffOnTest that likewise applies to both test pulse sequences PF1, PF2, since they are modulated with the same inlet valves 9a, 9b.

It is subsequently stipulated how many actuation pulses A are meant to be used for the first test pulse sequence PF1. According to FIG. 4, there is provision for a first number C1 of actuation pulses A of three for the first test pulse sequence PF1 (C1=3), i.e. the test vehicle acceleration aTest is prescribed for example by a pulse-width-modulated control signal Sa, Sb having three actuation pulses A for the inlet valves 9a, 9b, said control signal being used to cause a pressure buildup in the left-hand brake cylinder 4a on the assumption of an outlet valve 10a, 10b being activated at the same time. To this end, the effective test activation period tEffOnTest associated with the test vehicle acceleration aTest is distributed in equal portions over the three actuation pulses A, i.e. in each case tEffOnTest/3, for the first test pulse sequence PF1. Since each of these three actuation pulses A comes from the same inlet valve 9a, 9b, the switched-on period default value tE0 and the switched-off period default value tA0 are identical for each actuation pulse A, so that the first test pulse duration tOn1 that applies to each of the three actuation pulses A is obtained from:

$$tOn1 = tE0 - tA0 + tEffOnTest/3 = P0 + tEffOnTest/3.$$

FIG. 4 depicts the overall switching period default value P0 for each actuation pulse A instead of the switched-on period default value tE0 and the switched-off period default value tA0.

In general, for the first test pulse sequence PF1 comprising a first number C1 of actuation pulses A, it therefore follows that:

$$tOn1 = P0 + tEffOnTest/C1$$

By moderating this first test pulse sequence PF1 using the aforementioned first test pulse duration tOn1 for each of the three actuation pulses A, it is now assumed that the test vehicle acceleration aTest is obtained, this being able to be confirmed by the further evaluation.

The second test pulse sequence PF2 is stipulated in comparable fashion, a changed second number C2 of actuation pulses A being used in comparison with the first test pulse sequence PF1, i.e. C1=/=C2, with a second number C2 of seven having been chosen according to FIG. 4. Therefore, the same braking effect, i.e. the test vehicle acceleration aTest, is produced with a different number of actuation pulses A. The switched-on period default value tE0 and the switched-off period default value tA0 or the overall switching period default value P0, which are each concordant with the default values of the first test braking operation PF1, since the same inlet valves 9a, 9b are actuated, result in a second test pulse duration tOn2 of:

$$tOn2 = tE0 - tA0 + tEffOnTest/7 = P0 + tEffOnTest/7.$$

In general, from the second test pulse sequence PF2 comprising a second number C2 of actuation pulses A, it follows that:

$$tOn2 = P0 + tEffOnTest/C2$$

In an analogous manner, the two test pause durations tOff1, tOff2 for two such test braking operations using the outlet valves 10a, 10b result generally in tOff1=−P0+tEffOffTest/C1 tOff2=−P0+tEffOffTest/C2 i.e. with inverse arithmetic signs for the overall switching period default value P0, the number C1, C2 indicating not the number of actuation pulses A but rather the number of nonactuation pulses NA in this case.

In order now to verify whether the switching parameter default values tE0, tA0 or the overall switching period default value P0 are correct, the modulation of the respective test pulse sequence PF1, PF2 is followed by the first and a second vehicle dynamics change variable aIst1, aIst2, dwIst1, dwIst2, which indicate the reaction of the vehicle 3 to the respective test pulse sequence PF1, PF2, being captured and evaluated, wherein it is ensured that these vehicle dynamics change variables aIst1, aIst2, dwIst1, dwIst2 are actually attributable only to the respective test braking operation. This allows the reaction of the vehicle 3 to the respective test pulse sequence PF1, PF2 to be quantitatively ascertained, i.e. whether the actually expected change, i.e. the test vehicle acceleration aTest or a setpoint speed change dwSoll following therefrom, has also actually occurred.

Since the same value for the test vehicle acceleration aTest has been assumed for both test braking operations, the first actual speed change dwIst1, obtained on the basis of the first test pulse sequence PF1, and the second actual speed change dwIst2, obtained on the basis of the second test pulse sequence PF2, and also the measured first actual vehicle acceleration aIst1 and the second actual vehicle acceleration aIst2 should have identical values after the conclusion of the respective test braking operation.

In this case, comparable initial conditions are assumed for both test braking operations, which are carried out with staggered timing, said assumption being reached in particular by virtue of both test braking operations each being begun with the brake cylinder 4a, 4b bled, i.e. there is approximately the same braking behavior before the test braking operations. In the case of test braking operations using the outlet valves 10a, 10b, it is accordingly necessary to begin with an identical braking pressure pBa, pBb for both test braking operations, said braking pressure being able to be decreased by deactivation of the outlet valve 10a, 10b in order to bring about a measurable reaction by the vehicle 3. If need be, performance of the first test braking operation is thus followed by the respective brake cylinder 4a, 4b first of all being bled (or ventilated) and only then the second test braking operation being begun. This is achieved preferably by stipulating a very small test vehicle acceleration aTest in order to avoid high pressure changes in the brake cylinders 4a, 4b. Alternatively, the braking pressure pBa, pBb effective before the test braking operation can also be maintained in the brake cylinder 4a, 4b and a nonlinear braking behavior caused when the braking pressure pBa, pBb is increased (or reduced) as a result of the test braking operation can be estimated and included in an evaluation of the test braking operations.

In the control device 7, performance of the two test braking operations is followed by a check being performed to determine whether both test braking operations trigger comparable reactions by the vehicle 3 and the expected braking behavior has also occurred for both test braking operations. To this end, the first and second driving dynamics change variables aIst1, aIst2, dwIst1, dwIst2 can be compared with an expected value, i.e. the actual vehicle acceleration aIst1, aIst2 for the respective test braking operation is compared with the test vehicle acceleration aTest, which is identical for both test braking operations. Assuming a correctly assumed switched-off period default value tA0 and switched-on period default value tE0, the following should theoretically apply in the case described: aIst1=aIst2=aTest. The same applies to the actual speed change dwIst1, dwIst2, which should be consistent in each case with a setpoint speed change dwSoll following from the test vehicle acceleration aTest, said setpoint speed change likewise being identical for both test braking operations.

If this is the case, no adaptation of the switching parameters tE, tA is necessary and the switched-off period default value tA0 stored on the control device 7 and the switched-on period default value tE0 or overall switching period default value P0 can be retained for the braking operations that follow. The switching parameter default values tE0, tA0 are also retained if the driving dynamics change variables aIst1, aIst2, dwIst1, dwIst2 are each within the tolerance band B around the respectively expected value aTest, dwSoll, in order to avoid unwanted effects as a result of frequent adaptation of the switching parameters tE, tA. The tolerance band B in this case can be consistent with a maximum deviation of 10% from the expected value, for example.

If the respective driving dynamics change variable aIst1, aIst2, dwIst1, dwIst2 is outside the tolerance band B, a check is performed to determine whether the difference between the driving dynamics change variables ascertained in the two test braking operations, i.e. aIst1−aIst2 and dwIst1−dwIst2, is greater than a threshold value E, which is e.g. 10%. If this is not the case, no adaptation of the switching parameters tE, tA is necessary.

If the respective driving dynamics change variable aIst1, aIst2, dwIst1, dwIst2 is outside the tolerance band B and the difference exceeds the threshold value E, adaptation of the switching parameters tE, to is necessary, this being carried out as follows:

First of all, the actual vehicle acceleration aIst1, aIst2 obtained following the conclusion of the respective test braking operation after the modulation of the respective test pulse sequence PF1, PF2 is calculated by working back by virtue of a characteristic curve being used to check which effective actual activation periods tEffOnIst1, tEffOnIst2 follow from the respective actual vehicle acceleration aIst1, aIst2. A test braking operation using the outlet valves 10a, 10b results in calculation by working back in accordance with actual deactivation periods tEffOffIst1, tEffOffIst2. In this case, the same characteristic curve from which the effective test activation period tEffOnTest or test deactivation period tEffOffTest was also ascertained for the previously stipulated test vehicle acceleration aTest is taken as a basis each time. By working back from these two effective actual activation periods tEffOnIst1, tEffOnIst2 or actual deactivation periods tEffOffIst1, tEffOffIst2, it is subsequently calculated how high an overall switching period actual value PIst for both test braking operations is and how the overall switching period default value P0=tE0−tA0 and hence implicitly the switched-on period default value tE0 and the switched-off period default value tA0 accordingly need to be adapted for the next braking operation using the applicable solenoid control valve 9a, 9b, 10a, 10b.

In this case, the following applies to the test braking operation according to FIG. 4:

tEffOnIst1=(PIst−P0)×3+tEffOnTest+FEnv tEffOnIst2=(PIst−P0)×7+tEffOnTest+FEnv, where FEnv indicates an environment-dependent influencing factor affecting the actual vehicle acceleration aIst1, aIst2. If the overall switching period actual value PIst is equal to the overall switching period default value P0, the two effective actual activation periods tEffOnIst1, tEffOnIst2 are also concordant with the test activation period tEffOnTest except for the influencing factor FEnv, which means that no adaption would be necessary.

Subsequently, the difference tEffOnIst1−tEffOnIst2 is formed from both equations, as a result of which the influencing factor FEnv drops out. This means that it follows that:

$$tEffOnIst1 - tEffOnIst2 = (PIst - P0) \times (3-7)$$

or $$PIst = P0 + (tEffOnIst1 - tEffOnIst2)/(3-7).$$

In a manner generalized to an arbitrary number C1, C2 of actuation pulses A for the first test pulse sequence PF1 and the second test pulse sequence PF2, the overall switching period actual value PIst for the two test braking operations is therefore obtained from $$PIst = P0 + (tEffOnIst1 - tEffOnIst2)/(C1-C2),$$

where C1=/=C2.

Analogously, this can be derived for the outlet valves 10a, 10b in a comparable manner, so that the following applies to the overall switching period actual value PIst of the outlet valves 10a, 10b:

$$PIst = P0 + (tEffOffIst1 - tEffOffIst2)/(C1-C2),$$

where C1=/=C2.

In order to obtain the overall switching period actual value PIst, it is thus merely necessary to perform two—or else multiple—test braking operations and to detect the reaction thereof in the form of the driving dynamics change variable aIst1, aIst2, dwIst1, dwIst2 and to convert said reaction into the effective actual activation periods tEffOnIst1, tOnEffIst2 for the inlet valves 9a, 9b or into the effective actual deactivation periods tEffOffIst1, tEffOffIst2 for the outlet valves 10a, 10b. Influences remaining constant in both test braking operations can be ignored by the difference formation. Furthermore, it is assumed that ambient conditions, i.e. in particular voltages for actuating the solenoid control valves 9a, 9b, 10a, 10b, the ambient temperature, tire properties, brake properties, road properties or the like, do not change significantly between the test braking operations.

Under the conditions cited above, the overall switching period actual value PIst can be taken on as overall switching period default value P0 for the braking operations that follow in order to obtain as exact a reaction by the vehicle 3 as possible when a setpoint vehicle acceleration aSoll is prescribed externally. In order to improve the accuracy of the determination of the overall switching period actual value PIst further, it is also possible for more than two test braking operations to be performed using the same test vehicle acceleration aTest and a different number C1, C2, . . . of actuation pulses A or nonactuation pulses NA.

It is also possible for multiple teaching processes to be carried out in succession, i.e. performance of at least two test braking operations can be followed by the switching parameters tE, tA, P obtained from these test braking operations being used as switching parameter default values tE0, tA0, P0 for a further teaching process, for example in order to verify the measurement or to adapt the switching parameter default values tE0, tA0. P0 to changed ambient conditions, e.g. a changed ambient temperature.

A teaching process using the applicable number of test braking operations should be effected at a minimum velocity of 40 km/h while traveling. Should a safety-critical request for braking arrive at the control device 7 during a test braking operation or a teaching process, the teaching process can also be overridden or terminated at any time so as not to jeopardize safety.

Furthermore, the selection of the switching parameter default values tE0, tA0, P0 can result in an aging value being carried that takes into consideration the wear-dependent alteration of the respective solenoid control valve 9a, 9b, 10a, 10b and hence allows switching parameters tE, tA, P to be taught over the entire life of the respective solenoid control valve 9a, 9b, 10a, 10b too.

Figure 5:
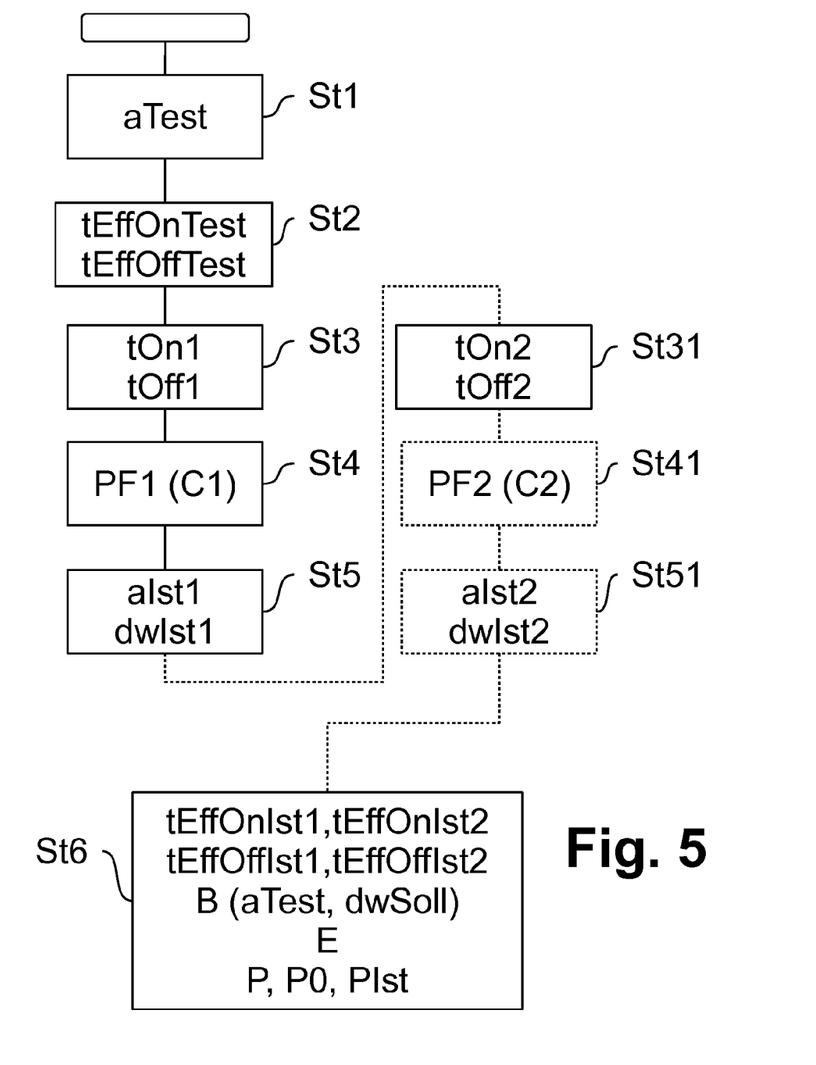
FIG. 5 shows a flowchart for a method according to an embodiment of the invention.

According to FIG. 5, a method according to an embodiment of the invention can be performed as follows: In an initial step St0, the method is started, for example when the vehicle 3 is started or else externally requested braking is detected by means of the XBR signal SXBR.

In a first step St1, a test vehicle acceleration aTest is stipulated that is meant to be used to perform the test braking operations. For this test vehicle acceleration aTest, an effective test activation period tEffOnTest or an effective test deactivation period tEffOffTest is subsequently ascertained in a second St2, depending on whether the test braking operations are meant to be caused by an inlet value 9a, 9b or an outlet valve 10a, 10b, the respective effective test period tEffOnTest, tEffOffTest indicating the period of time during which the respective solenoid control valve 9a, 9b, 10a, 10b needs to remain in its activated or deactivated position so that a braking pressure pBa, pBb leading to the test vehicle acceleration aTest is modulated in the applicable brake cylinder 4a, 4b.

In a third step St3, the first test pulse duration tOn1 or first pause duration tOff1 is ascertained from the effective test activation period tEffOnTest or the effective test deactivation period tEffOffTest and using the switching parameter default values tE0, tA0, P of the relevant solenoid control valve 9a, 9b and, in a fourth step St4, stipulation of the first number C1 of actuation pulses A or nonactuation pulses NA is followed by the control signal Sa, Sb being used to output a corresponding first test pulse sequence PF1 as described above to the relevant modulator(s) 8a, 8b, the respective solenoid control valve 9a, 9b, 10a, 10b being actuated by means of the first test pulse sequence PF1 having the first number C1 of actuation pulses A for in each case the first test pulse duration tOn1 or not being actuated or activated using the first number C1 of nonactuation pulses NA for in each case the first test pause time tOff1 between two actuation pulses A in order to cause the test braking operation. In a fifth step St5, the reaction of the vehicle 3 to the test braking operation is obtained by virtue of the first driving dynamics change variable aIst1, dwIst1 being captured.

On the basis of the first driving dynamics change variable aIst1, dwIst1, a sixth step St6 is then used, as described above, to evaluate whether adaption of the switching parameters tE, tA, P is necessary. This is achieved by simultaneously resorting to a second driving dynamics change variable aIst2, dwIst2 from a second test braking operation at the same wheel 6a, 6b. The second test braking operation using the second test pulse sequence PF2, which has a second number C2 of actuation pulses A or nonactuation pulses NA and takes place with staggered timing in relation to the first test braking operation, is indicated in dashes in FIG. 5 in steps St31, S41, St42. The ascertainment of the applicable times and parameters for the second test braking operation PF1 can take place analogously to and in parallel with the ascertainment of the times and parameters for the first test braking operation PF2, but the second test braking operation PF2 is carried out with staggered timing in relation thereto.

The rating in the sixth step St6 can be achieved in this case by virtue of a comparison with values aTest, dwSoll to be expected taking place each time with the inclusion of the tolerance band B and the threshold value E. The adaptation takes place in this case by ascertaining the overall switching period P by means of the overall switching period actuation value PIst by virtue of a difference formation of the two test braking operations as described above.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Braking system
2 Rear axle
3 Vehicle
4a, b Brake cylinder
5a, b Service brake
6a, b Wheels
7 Control device
8a, 8b Modulator
9a, 9b Inlet valve
10a, 10b Outlet valve
11 Pressure medium supply
12a, 12b Bleed connection
13a, 13b Speed sensor
14 Longitudinal acceleration sensor
aTest Test vehicle acceleration
aIst Actual vehicle acceleration
aIst1 First actual vehicle acceleration
aIst2 Second actual vehicle acceleration
aSoll Setpoint vehicle acceleration
A Actuation pulse
B Tolerance band
C1 First number of actuation pulses
C2 Second number of actuation pulses
dwIst Actual speed change
dwIst1 First actual speed change
dwIst2 Second actual speed change
dwSoll Setpoint speed change
dwSoll Setpoint speed change
E Threshold value
FEnv Influencing factor
NA Nonactuation pulse
P0 Overall switching period default value
p11 Supply pressure
P Overall switching period
pBa, pBb Braking pressure
PF1 First test pulse sequence
PF2 Second test pulse sequence
PIst Overall switching period actual value
Sa, Sb Control signal
SDa, SDb Speed sensor signal
SXBR XBR signal
tEffOn Effective activation period
tEffOnTest Effective test activation period
tEffOnIst1 First effective actual activation period
tEffOnIst2 Second effective actual activation period
tEffOff Effective deactivation period
tEffOffTest Effective test deactivation period
tEffOffIst1 First effective actual deactivation period
tEffOffIst2 Second effective actual deactivation period
tE Switched-on period
tE0 Switched-on period default value
tEIst Switched-on period actual value
to Switched-off period
tA0 Switched-off period default value
tAIst Switched-off period actual value
tOff Pause duration
tOff1 First test pause duration
tOff2 Second test pause duration
tOn Pulse duration
tOn1 First test pulse duration
tOn2 Second test pulse duration
w Speed
w1 First speed
w2 Second speed

The invention claimed is:

1. A method for specifying switching parameters of a solenoid control valve in a braking system of a vehicle, the method comprising:

stipulating a test vehicle acceleration;

ascertaining at least two test pulse sequences, wherein the test pulse sequences are each ascertained on the basis of the stipulated test vehicle acceleration and on the basis of switching parameter default values for the respective solenoid control valve, and the test pulse sequences have actuation pulses and adjoining nonactuation pulses, wherein during an actuation pulse an activation of the respective solenoid control valve and during a nonactuation pulse a deactivation of the respective solenoid control valve takes place;

actuating the respective solenoid control valve using the at least two test pulse sequences in order to cause at least two test braking operations, wherein the respective test pulse sequence causes an alteration of a braking pressure at a service brake of the braking system such that a change in the driving dynamics of the vehicle results;

ascertaining driving dynamics change variables in order to detect the change in the driving dynamics of the vehicle as a result of the actuation using the respective test pulse sequence, and adapting the switching parameter default values for the solenoid control valve on the basis of the driving dynamics change variables in order to teach the switching parameters of the solenoid control valve.

2. The method as claimed in claim 1, wherein the test pulse sequences are ascertained by virtue of a test pulse duration being ascertained for the actuation pulses and/or a test pause duration being ascertained for the nonactuation pulses,
wherein:
the test pulse duration is ascertained based on a number of actuation pulses per test pulse sequence and based on the respectively stipulated test vehicle acceleration and the switching parameter default values, and/or
the test pause duration is ascertained based on a number of nonactuation pulses per test pulse sequence and based on the respectively stipulated test vehicle acceleration and the switching parameter default values, and
wherein the test pulse sequences are made up:
of the respective number of actuation pulses that have the test pulse duration calculated for the respective test pulse sequence, and/or
of the respective number of nonactuation pulses that have the test pause duration calculated for the respective test pulse sequence.

3. The method as claimed in claim 2, wherein the test pulse duration for the respective test pulse sequence is ascertained based on an effective test activation period, wherein the effective test activation period indicates the period of time for which the solenoid control valve needs to be transferred to its activated position in order to cause an alteration of the braking pressure at the service brake such that the stipulated test vehicle acceleration for this test pulse sequence is implemented.

4. The method as claimed in claim 2, wherein the test pause duration for the respective test pulse sequences is ascertained on the basis of an effective test deactivation period, wherein the effective test deactivation period
indicates the period of time for which the solenoid control valve needs to be transferred to its deactivated position in order to cause an alteration of the braking pressure at the service brake such that the stipulated test vehicle acceleration for this test pulse sequence is implemented.

5. The method as claimed in claim 3, wherein the effective test activation period and/or the effective test deactivation period is ascertained based on a response pressure of the respective service brake, wherein the effective test activation period and/or the effective test deactivation period for the stipulated test vehicle acceleration follows from a characteristic curve.

6. The method as claimed in claim 3, wherein
the test pulse duration for the respective test pulse sequence follows from the sum of the effective test activation period, split over the respective number of actuation pulses of the respective test pulse sequence, and the switching parameter default values, and/or
the test pulse duration follows from the sum of the effective test deactivation period, split over the respective number of nonactuation pulses of the respective test pulse sequence, and the switching parameter default values.

7. The method as claimed in claim 1, wherein adapting of the switching parameter default values takes place only if at least one of the driving dynamics change variables is outside a tolerance band around an expected value for the respective driving dynamics change variable.

8. The method as claimed in claim 1, wherein switching parameter default values used are production-contingent estimated values or previously taught switching parameters for the solenoid control valve.

9. The method as claimed in claim 1, wherein the driving dynamics change variable considered is merely the change in the driving dynamics to that is effected in response to the actuating of the solenoid control valve using the respective test pulse sequence.

10. The method as claimed in claim 1, wherein:
the switching parameters used are a switched-on period and a switched-off period or an overall switching period following from a difference between switched-on period and switched-off period, and
the test pulse sequence is ascertained by virtue of the switching parameter default values used being a switched-on period default value and a switched-off period default value or an overall switching period default value following from a difference between switched-on period default value and switched-off period default value.

11. The method as claimed in claim 1, wherein a first test pulse sequence comprising a first number of actuation pulses or nonactuation pulses for performing a first test braking operation and a second test pulse sequence comprising a second number of actuation pulses or nonactuation pulses for performing a second test braking operation are ascertained,
wherein the same test vehicle acceleration is stipulated for both test pulse sequences.

12. The method as claimed in claim 11, wherein the first number is not equal to the second number.

13. The method as claimed in claim 11, wherein the at least two test pulse sequences are modulated with staggered timing in relation to one another on a wheel-by-wheel basis to the same solenoid control valve or on an axle-by-axle basis to the same solenoid control valves.

14. The method as claimed in claim 11, wherein adapting of the switching parameter default values takes place only if a first driving dynamics change variable, which results from the first test braking operation, differs from a second driving dynamics change variable, which results from the second test braking operation, by more than a threshold value.

15. The method as claimed in claim 11, wherein the switching parameter default value is adapted on the basis of
a difference between the ascertained driving dynamics change variables, and/or
a difference between ascertained effective actual activation periods and on the basis of the difference in the number of actuation pulses for the first and second pulse sequences, and/or
a difference between ascertained effective actual deactivation periods and on the basis of the difference in the number of nonactuation pulses for the first and second pulse sequences,
wherein the effective actual activation periods and/or actual deactivation periods are ascertained from the ascertained driving dynamics change variables of the respective pulse sequence and each indicate the period of time for which the solenoid control valve is actually transferred to its activated or deactivated position in order to cause the respective ascertained driving dynamics change variable.

16. The method as claimed in claim 1, wherein the ascertainment of the respective test pulse sequence involves taking into consideration what braking pressure is already applied to the service brakes before the respective solenoid control valve is actuated using the respective test pulse sequence.

17. The method as claimed in claim 1, wherein the teaching of the switching parameter is effected by means of the driving dynamics change variable without recourse to the braking pressure measured by means of a pressure sensor.

18. The method as claimed in claim 1, wherein the braking pressure in the brake cylinder of the respective service brake is set to a predefined value and/or the brake cylinders of the respective service brake are bled before the respective solenoid control valve is actuated using the respective test pulse sequence.

19. The method as claimed in claim 1, wherein the driving dynamics change variable is captured by a speed sensor and/or by a longitudinal acceleration sensor, wherein the driving dynamics change variable used is an actual speed change or an actual vehicle acceleration and these can be compared with an expected value, wherein the expected value is the stipulated test vehicle acceleration and/or a setpoint speed change of the wheels that follows therefrom.

20. The method as claimed in claim 19, wherein a driving dynamics change variable ascertained by means of the speed sensor is compared with a driving dynamics change variable captured by means of the longitudinal acceleration sensor in order to plausibilize the ascertained vehicle dynamics change variable.

21. The method as claimed in claim 1, wherein the switching parameters for an inlet valve in the form of a solenoid control valve and/or for an outlet valve in the form of a solenoid control valve are taught, wherein during an actuation using a number of actuation pulses, the inlet valve changes, on account of activation, to its open position, in which a change in the driving dynamics can be caused by increasing the braking pressure if the outlet valve has simultaneously been transferred to its closed position, and during a nonactuation using a number of nonactuation pulses, the outlet valve changes, on account of deactivation, to its open position, in which a change in the driving dynamics can be caused by reducing the braking pressure if the inlet valve has simultaneously been transferred to its closed position.

22. A braking system, comprising:

service brakes, modulators, connected upstream of the service brakes, for modulating a braking pressure at brake cylinders of the service brakes by electrically actuating solenoid control valves in the respective modulators by control signals, wherein the control signals are output by a control device, and wherein the control device is designed to ascertain at least two test pulse sequences for performing at least two test braking operation and to modulate the test pulse sequences to the solenoid control valves, and to take a change in the driving dynamics on account of the test braking operations as a basis for ascertaining and teaching switching parameters of the solenoid control valves.

23. The braking system as claimed in claim 22, wherein the control device is designed to actuate the solenoid control valves on a wheel-specific or axle-specific or side-specific basis.

24. The braking system as claimed in claim 22, wherein the control device is designed to ascertain the switching parameters without recourse to a pressure sensor.

25. The braking system as claimed in claim 22, wherein the solenoid control valves in the modulator are embodied as inlet valves for increasing the braking pressure at the respective service brake and as outlet valves for reducing the braking pressure at the respective service, wherein on account of an actuation using an actuation pulse the inlet valves change to their open position in order to increase the braking pressure when the outlet valve is simultaneously closed, and on account of a nonactuation using a nonactuation pulse the outlet valves change to their open position in order to reduce the braking pressure when the inlet valve is simultaneously closed.

\* \* \* \* \*